United States Patent [19]

Losapio

[11] Patent Number: 4,605,842
[45] Date of Patent: Aug. 12, 1986

[54] SPRING-LOADED INSTALLATION FOR ELECTRONIC REGISTER MODULE

[75] Inventor: Peter F. Losapio, Dover, N.H.

[73] Assignee: General Electric Company, Somersworth, N.H.

[21] Appl. No.: 772,700

[22] Filed: Sep. 5, 1985

[51] Int. Cl.[4] .................... G01R 19/16; G06F 15/20
[52] U.S. Cl. ........................ 235/1 D; 235/144 MA; 324/103 R; 324/116; 364/483
[58] Field of Search ...................... 235/10, 144 MA; 324/103 R, 73 R, 116; 364/483, 900; 377/119

[56] References Cited

U.S. PATENT DOCUMENTS

| | | | |
|---|---|---|---|
| 3,400,586 | 9/1968 | Wilson | 324/103 R X |
| 4,179,654 | 12/1979 | Germer | 324/116 |
| 4,197,582 | 4/1980 | Johnston et al. | 324/116 X |
| 4,229,795 | 10/1980 | Viewey et al. | 324/116 X |
| 4,283,772 | 8/1981 | Johnston | 364/483 X |
| 4,301,508 | 11/1981 | Anderson et al. | 324/116 X |
| 4,361,872 | 11/1982 | Spalsti | 364/483 |
| 4,368,519 | 1/1983 | Kennedy | 364/483 |

Primary Examiner—Benjamin R. Fuller
Attorney, Agent, or Firm—Robert E. Brunson; Thomas R. Morrison

[57] ABSTRACT

A skid plate retained below an electronic register module includes a plurality of cantilevered spring fingers formed by parallel pairs of slots in the skid plate. Each cantilevered spring finger includes a frusto-conical button which bears against a back plate in a housing during installation of the electronic register module therein. A rear end of the back plate includes a pair of mouse holes into which a rear pair of frusto-conical buttons engage during an intermediate stage of inserting the electronic register module into the housing. This engagement establishes the correct side-to-side positioning of the rear end of the electronic register module. A front cantilevered spring finger and its associated frusto-conical button resiliently urge the front of the electronic register module upward during substantially all stages of installation and in the operational position thereof. When the electronic register module is advanced further into the housing, the rear pair of frusto-conical buttons ride up onto the surface of the back plate thereby providing an upward resilient force for securing the electronic register module into its operational position. At least one depression is provided in the back plate for receiving a frusto-conical button at the operational position of the electronic register module.

9 Claims, 7 Drawing Figures

SPRING-LOADED INSTALLATION FOR ELECTRONIC REGISTER MODULE

BACKGROUND OF THE INVENTION

The present invention relates to electric meters containing electronic registers and, more particularly, to a physical construction of electronic registers adapted for efficient integration with their electric meters.

Conventional electric meters employ an aluminum disk driven as a rotor of a small induction motor by an electric field at a speed proportional to the electric power being consumed by a load. Geared dials, or cyclometer discs, integrate the disk motion to indicate the total energy consumed, conventionally measured in kilowatt hours (one kilowatt hour equals one thousand watts of power consumption for one hour).

In addition to the above measurement of consumption, some electric meters contain means for separating the consumption into portions occurring during predetermined peak and off-peak hours, and means for recording maximum demand during those predetermined periods of time in order to adjust billing according to such parameters. In one such demand register disclosed in U.S. Pat. No. 3,586,974, a mechanical demand register records the power usage during a predetermined period of time, and stores that value for later reading. The predetermined period of time may be, for example, the time between meter readings, or a period of time corresponding to a billing period of the utility providing the power. A clockwork mechanism restarts the demand register at the ends of regular demand intervals of, for example, a fraction of an hour so that, at the end of the predetermined period, the stored value represents the highest value of power usage occurring during any one of the regular demand intervals in the predetermined period.

Mechanical registers, such as disclosed in the referenced U.S. patent, have limited flexibility. The design of a particular meter is not transferable to another meter having a different physical configuration. In addition, the measurement functions of a particular register cannot be redefined without major mechanical redesign. Greater flexibility may be obtained using electronic acquisition, integration and processing of power usage. An electronic processor such as, for example, a microprocessor, may be employed to manage the acquisition, storage, processing and display of usage and demand data. U.S. Pat. Nos. 4,179,654; 4,197,582; 4,229,795; 4,283,772; 4,301,508; 4,361,872 and 4,368,519, among others, illustrate the flexibility that electronic processing brings to the power and energy usage measurements. Each of these electronic measurement devices includes means for producing an electronic signal having a characteristic such as a frequency or a pulse repetition rate, related to the rate of power usage. The electronic processor is substituted for the mechanical register of the prior art to keep track of the power usage during defined periods of time.

Various aspects of an electronic register which may benefit from the techniques of the present invention are disclosed in U.S. patent application Ser. Nos. 599,684; 599,685; 599,736; 599,744; 599,683; 599,735; 599,743 and 599,742, all filed on Apr. 12, 1984; and Ser. Nos. 550,407 and 550,142 both filed on Nov. 10, 1983, the disclosures of which are herein incorporated by reference. For present purposes, it is sufficient to state that, since the electronic register is called on to perform many functions, it necessarily requires the inclusion of a large number of parts when compared to the number of parts in the electro-mechanical portion of the electric meter. As a consequence, it can be anticipated that an electronic register of an electric meter may require field service more often than the remainder of the electric meter. Thus, a desirable characteristic of an electronic register is ease of troubleshooting and service.

A favored technique for field service on an electronic register includes substitution of a known-good electronic register for one that is apparently in a failed condition. In order to avoid the need to reprogram the programmed constants for a particular application, and to avoid losing stored billing data, a method was disclosed in the referenced patent applications for copying the contents from a non-volatile storage in one electronic register to a non-volatile storage in another electronic register which may then be substituted for the original electronic register. The above-referenced patent applications also disclose apparatus and method for storing necessary data in non-volatile storage in the event of a power outage or entry into a test mode. Since such apparatus and methods are fully disclosed in the referenced patent applications they need not be repeated here.

Since substitution is expected in field service, it is important that an electronic register provides means for ensuring secure connection to the remainder of the register.

OBJECTS AND SUMMARY OF THE INVENTION

It is an object of the invention to provide an electronic register and a register frame which overcome the drawbacks of the prior art.

It is a further object of the invention to provide an electronic register module which includes resilient means for retaining the electronic register module in its operational position within a register frame.

It is a further object of the invention to provide an electronic register module and a register frame which cooperate to provide resilient force for positively locking the electronic register module in its operational position at the end of insertion.

Briefly stated, the present invention provides a skid plate retained below an electronic register module having a plurality of cantilevered spring fingers formed by parallel pairs of slots in the skid plate. Each cantilevered spring finger includes a frusto-conical button which bears against a back plate in a housing during installation of the electronic register module therein. A rear end of the backplate includes a pair of mouse holes into which a rear pair of frusto-conical buttons engage during an intermediate stage of inserting the electronic register module into the housing. This engagement establishes the correct side-to-side positioning of the rear end of the electronic register module. A front cantilevered spring finger and its associated frusto-conical button resiliently urge the front of the electronic register module upward during substantially all stages of installation and in the operational position thereof. When the electronic register module is advanced further into the housing, the rear pair of frusto-conical buttons ride up onto the surface of the back plate thereby providing an upward resilient force for securing the electronic register module into its operational position. At least one depression is provided in the back plate for receiving a frusto-conical button at the operational position of the electronic register module.

According to an embodiment of the invention, there is provided a register and meter frame for an electric meter comprising a demand register module, the meter frame including at least a face plate, and a back plate, means for affixing the back plate spaced a predetermined distance from the face plate thereby providing a predetermined space therebetween, the electronic register module including a skid plate affixed thereto, the skid plate including at least a first cantilevered spring finger at a front end thereof and a second cantilevered spring finger at a rear end thereof, a first button in the first cantilevered spring finger, the first button contacting and sliding upon the back plate during insertion and removal of the electronic register module, and the first cantilevered spring finger providing a first resilient force urging a front end of the electronic register module toward the face plate, a second button in the second cantilevered spring finger, means at a rear surface of the back plate for providing side-to-side guidance of the second button during an intermediate stage of the insertion and removal, and the second button including means for sliding contact with a surface of the back plate, and the second cantilevered spring finger providing a second resilient force urging a rear end of the electronic register module toward the face plate, whereby the electronic register module is secured in an operational position.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENT

The present invention may be adapted to any suitable style of electric meter which employs an element rotating at a speed proportional to power consumption, including single phase meters and polyphase meters. For concreteness, however, the following detailed description is directed to an illustrative example of a 2-wire single phase meter of the type having a single current coil and a single voltage coil.

Figure 1:
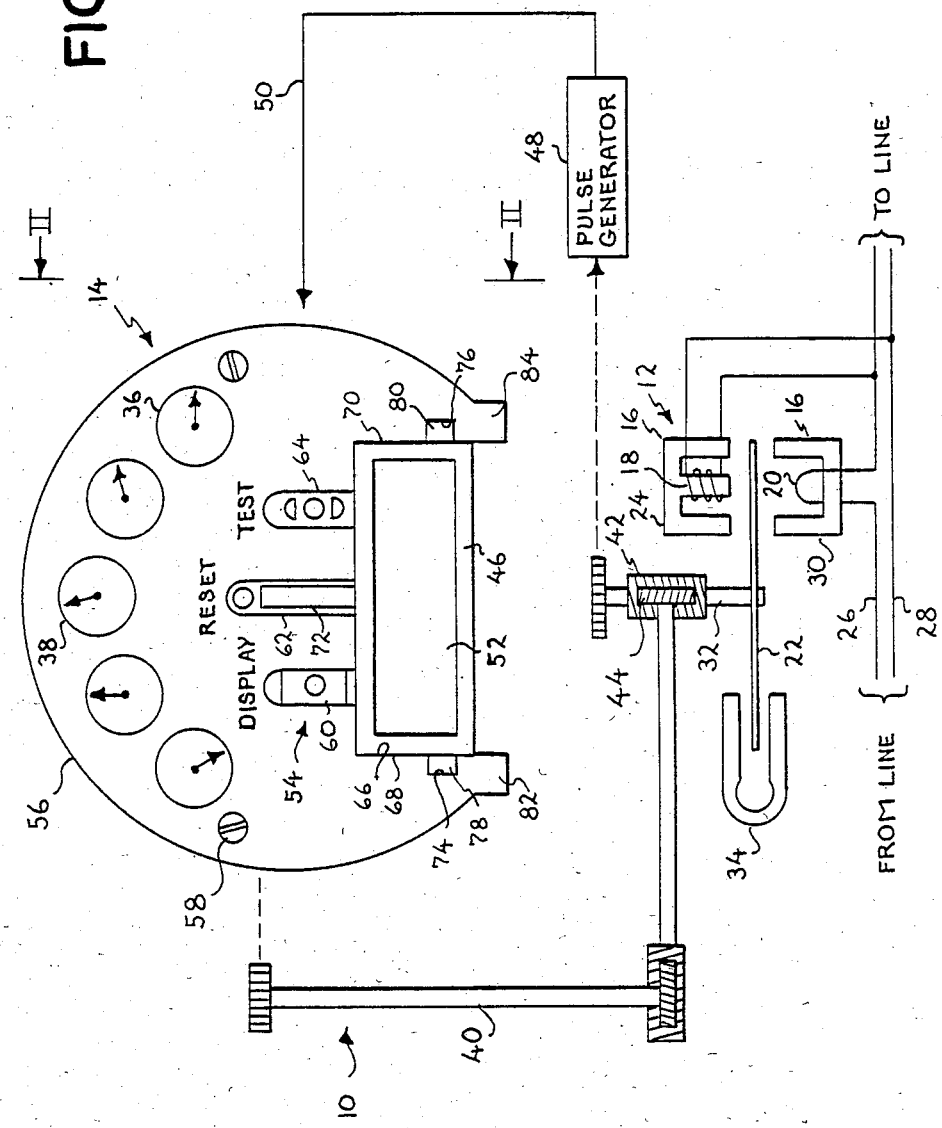
FIG. 1 is a schematic diagram of an electric meter containing an electronic register according to an embodiment of the invention.

Referring now to FIG. 1, there is shown, generally at 10, an electric meter which includes a small induction motor 12 driving a register 14. Induction motor 12 includes a stator 16 made up of a voltage coil 18 and a current coil 20 disposed on opposite sides of a disk 22. Voltage coil 18 employs a core 24 including a large number of turns of fine wire wound thereon. Voltage coil 18 is connected across lines 26 and 28 which feed power to a load (not shown). Current coil 20 employs a core 30 upon which a small number of turns, typically one or two, of heavy conductor are wound. Current coil 20 is connected in series with the power being fed to the load on line 26.

Disk 22 is affixed to a shaft 32 which is supported on suitable bearings (not shown) to permit concerted rotation of disk 22 and shaft 32 under the influence of a rotating magnetic field produced by the combined influence of voltage coil 18 and current coil 20. A permanent magnet 34, having its poles disposed on opposite sides of disk 22, applies a retarding force proportional to the rotational speed of disk 22. The rotational torque produced by voltage coil 18 and current coil 20, combined with the retarding torque produced by permanent magnet 34, is effective to rotate disk 22 at a speed which is proportional to the product of the voltage and the current; that is, the power consumed by the load.

Register 14 includes a watthour register 36 which may include, for example, a plurality of dials 38 which are suitably geared and driven by a mechanical coupling 40 in proportion to the rotation of shaft 32. In the embodiment shown, mechanical coupling 40 includes a worm 42, which may be integrally formed in shaft 32. Worm 42 engages and rotates a worm gear 44. Additional elements may be present in mechanical coupling 40 for coupling the rotation of worm gear 44 to watthour register 36 with or without change in speed and direction according to the design of the particular electric meter 10. As is conventional, watthour register 36 totals the number of revolutions of shaft 32, suitably scaled by the gear ratios employed, for billing purposes.

An electronic register module 46 receives pulses from a pulse generator 48 on a line 50 in response to the rotation of shaft 32. An electronic register module 46 is modular in the sense that it can be inserted into, and removed from, register 14 as a unit. An electronic register module 46 includes a display 52 of any convenient type such as, for example, a liquid crystal display, for presenting billing and troubleshooting data to a user. In addition, electronic register module 46 includes a set of control switches 54 whose functions are described more fully in the referenced patent applications. An electronic register module 46 is insertable into register 14 by sliding it straight upward in FIG. 1 to the position shown.

A face plate 56, preferably of sheet metal and most preferably of aluminum, covers a face of register 14 and optionally provides a surface upon which necessary indicia may be printed or otherwise included thereon. Face plate 56 is affixed at its upper portion to a foundation structure (not shown) of electric meter 10 by screws 58. The lower portion of face plate 56 is without screws or other fasteners for holding it to the foundation structure and therefore is capable of being deflected outward for permitting insertion and removal of electronic register module 46. Three vertical slots 60, 62 and 64 are disposed in face plate 56 joining a rectangular slot 66 opening to the bottom of face plate 56.

Sides 68 and 70 extend outward through rectangular slot 66 to provide guide surfaces for guiding electronic register module 46 into place within register 14. A guide boss 72 extends outward from electronic register module 46 through vertical slot 62 for providing further guidance while sliding electronic register module 46 into upward register 14. Locking notches 74 and 76 open transversely from opposed sides of rectangular slot 66. Locking ramps 78 and 80 fit within locking notches 74 and 76, respectively, for locking electronic register module 46 into its operational position, shown in FIGS. 1 and 2. During the act of sliding electronic register module 46 upward into the operational position shown, locking ramps 78 and 80 outwardly deflect the unsecured lower portion of face plate 56 until locking ramps 78 and 80 are fully seated within locking notches 74 and 76, respectively. At that point, face plate 56 snaps back into its undeflected position to lock electronic register module 46 in position.

A pair of finger tabs 82 and 84 extend downward past the lower extremity of electronic register module 46 for deflecting the lower unsecured portion of face plate 56 outward, thereby releasing the lock provided by locking ramps 78 and 80 in locking notches 74 and 76, respectively, and permitting electronic register module 46 to be withdrawn from register 14.

Figure 2:
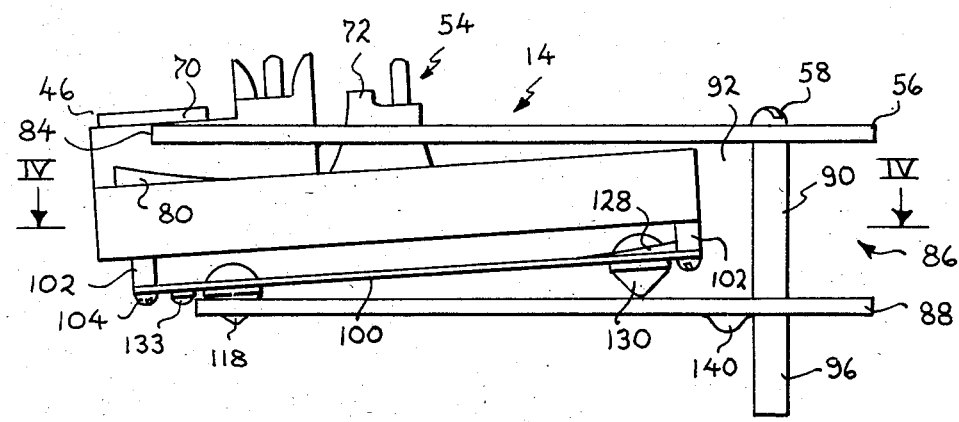
FIG. 2 is a simplified side view of the register of the electric meter taken along II—II in FIG. 1, with an electronic register module in an initial stage of insertion.

Referring now to FIG. 2, from which all elements not essential to the description of the invention are omitted, face plate 56 is shown as part of a housing 86. Housing 86 also includes a back plate 88 secured parallel to face plate 56 and spaced therefrom by a plurality of conventional posts 90, only one of which is shown. A space 92 between face plate 56 and back plate 88 is occupied by gearing of watthour register 36 (not shown) and by electronic register module 46, illustrated partly inserted therein. A plurality of posts 96 (only one of which is shown), which may be coaxial with posts 90, are provided for affixing register 14 to a conventional base (not shown).

Since the torque available to drive the mechanical components in register 14 is extremely limited, manufacturers use great care in attaining precise tolerances in the mesh between gears and worms in order to reduce friction therein. Since electronic register module 46 and mechanical components of register 14 share space 92, it is critically important to provide means for guiding electronic register module 46 to and from its operational position in a manner which avoids contact with the mechanical components or the imposition of forces which are capable of distorting housing 86 in a fashion disruptive to the fit between the mechanical components.

In addition, the means for installing and securing electronic register module 46 in space 92 must be easy to use as well as provide secure retention, in order to withstand the rugged handling to which electric meters may be subjected.

Figure 3:
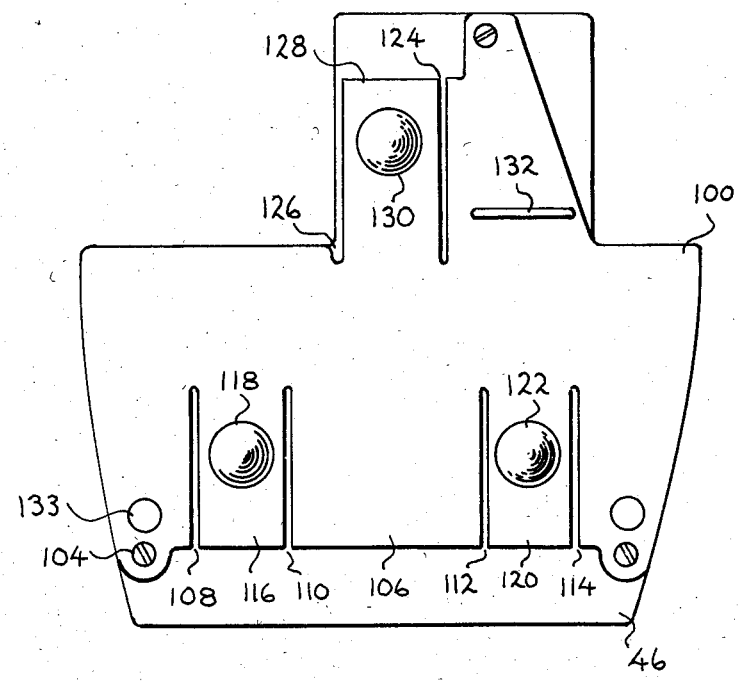
FIG. 3 is a bottom view of the electronic register module of FIG. 2. This view is left-right transposed from other views because it is inverted to show the elements important to the description.

Referring now also to FIG. 3, wherein electronic register module 46 is shown upside down, a skid plate 100 is secured and spaced below electronic register module 46 by a plurality of posts 102 and screws 104. A rear edge 106 of skid plate 100 includes first, second, third and fourth slots 108, 110, 112 and 114, respectively. Slots 108 and 110 define a cantilevered spring finger 116 having a frusto-conical button 118 therein. Similarly, slots 112 and 114 define a cantilevered spring finger 120 having a frusto-conical button 122 therein. A long slot 124 and a short slot 126 disposed at a forward edge of skid plate 100, define between them a cantilevered spring finger 128 having a frusto-conical button 130 therein. An access slot 132 in skid plate 100 provides access to electronic components (not shown) on electronic register module 46 for test or adjustment thereof. A slide button 133 is disposed in skid plate 100 just forward of each screw 104. Each slide button 133 has a slightly higher profile than its screw 104 and thus contacts back plate 88 instead of its respective screw 104. Slide button 133 is preferably a smooth, hard plastic material such as, for example, molded Nylon, and slides smoothly on back plate 88, thereby preventing galling by roughness on screws 104.

Figure 4:
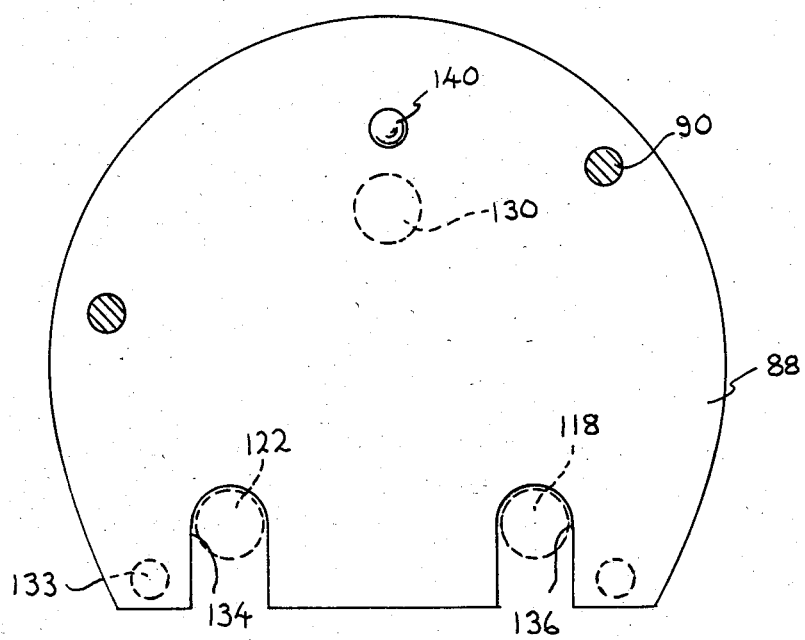
FIG. 4 is a view of a meter taken along IV—IV in FIG. 2 showing the upper surface of a back plate with the locations of certain elements of FIG. 2 indicated in dashed lines.

Referring now also to FIG. 4 (FIGS. 2, 3 and 4 are now being discussed), and remembering that the view in illustration FIG. 3 is upside down, back plate 88 includes first and second mouse holes 134 and 136. In the partly-installed condition of electronic register module 46 shown in FIG. 2, frusto-conical buttons 118 and 122 engage, and protrude partly through, mouse holes 136 and 134, respectively, whereby the rear end of electronic register module 46 is positively guided into the correct left-right position. A depression 140 in back plate 88 defines a home position for frusto-conical button 130, as will be further described.

When the front end of electronic register module 46 is inserted between face plate 56 and back plate 88, cantilevered spring finger 128 is flexed upward thus applying an upward force to the front end and ensuring that the upper surface of electronic register module 46 remains in resiliently urged contact with the lower surface of face plate 56. As electronic register module 46 is advanced into the position shown in FIGS. 2 and 4, the left-right position of the rear end of electronic register module 46 is established by engagement between frusto-conical buttons 118 and 122 and mouse holes 136 and 134, respectively. This aligns guide boss 72 (FIG. 1) with vertical slot 62 and ensures that electronic register module 46 is properly aligned with rectangular slot 66 without permitting the development of distorting forces.

Figure 5:
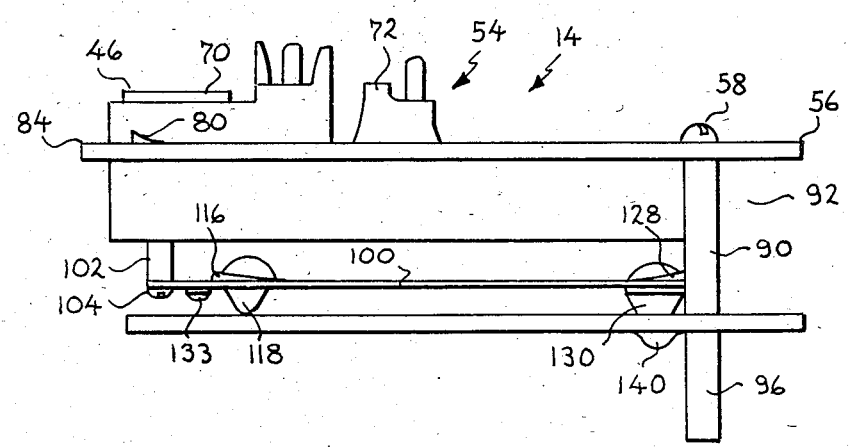
FIG. 5 is a simplified side view corresponding to FIG. 2, with the electronic register module fully inserted.
Figure 6:
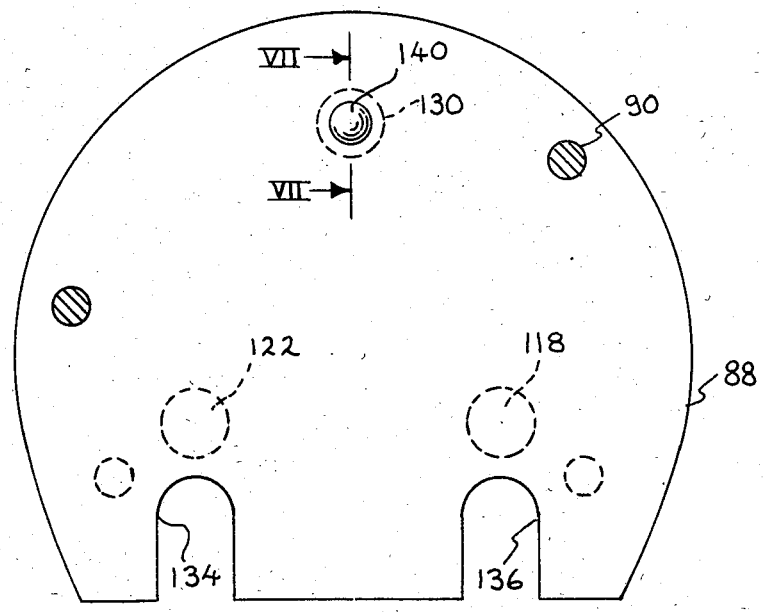
FIG. 6 is a view of the back plate corresponding to that of FIG. 4 except showing the locations of certain elements of the electronic register module when it is fully installed.

Referring now to FIGS. 5 and 6, as electronic register module 46 is further advanced to the fully-installed position shown cantilevered spring finger 128 drops a small distance into depression 140, thereby locking electronic register module 46 into its home position. When cantilevered spring finger 128 moves toward and into depression 140, it retains a substantial deflection therein and thus maintains a predetermined upward force to hold the forward edge of electronic register module 46 securely against the underside of face plate 56. Frusto-conical buttons 118 and 122 ride up out of mouse holes 136 and 134, respectively, onto the surface of back plate 88. As a consequence, cantilevered spring fingers 116 and 120 (only cantilevered spring finger 116 is shown in FIG. 5) are deflected upward thus urging electronic register module 46 upward into full contact with the lower surface of face plate 56. Also at the home position, locking ramp 78 and locking ramp 80 latch upward into locking notch 74 and locking notch 76, respectively, thus resisting movement of electronic register module 46 from its installed position.

Figure 7:
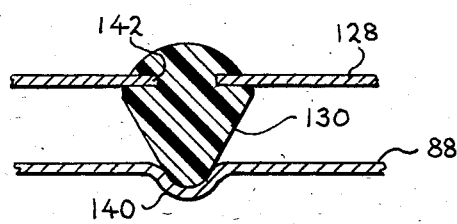
FIG. 7 is a cross section taken along VII—VII in FIG. 6.

Referring momentarily to FIG. 7, depression 140 is seen to be a depression in skid plate 100, into which the end of frusto-conical button 130 fits, thereby providing a detent. In addition, a hole 142 through cantilevered spring finger 128 provides for affixing frusto-conical button 130 thereto. Preferably, frusto-conical button 130 is affixed by thermally staking a portion of frusto-conical button 130 over the upper side of cantilevered spring finger 128. Similar attachment methods may be used for affixing frusto-conical buttons 118 and 122 and slide buttons 133 in their respective locations. It would be clear to one skilled in the art that a depression (not shown) similar to depression 140 may be provided in back plate 88 for one or both of frusto-conical buttons 118 and 122 for additional retention of these elements in their operational positions. In some installations, advantage may be taken of the fact that the attachment of some parts to back plate 88 may require the formation of a depression therein. If such a depression can be conveniently located with respect to the operational positions of frusto-conical buttons 118, 122 and 130, a separate operation to form depression 140 may not be required.

Electronic register module 46 may be removed by deforming finger tab 82 and finger tab 84 upward sufficiently to clear locking ramp 78 and locking ramp 80, respectively, and by manually urging it backward. As this is being performed, guidance of the forward end of electronic register module 46 is performed by guide boss 72 in vertical slot 62. Later, frusto-conical buttons 118 and 122 drop downward into their respective mouse holes 136 and 134 to guide the rear end of electronic register module 46 during an intermediate stage of withdrawal.

In a further embodiment of the invention (not shown), the three cantilevered spring fingers 116, 120 and 128 are replaced with a single resilient device centered in skid plate 100. A resilient force of the single resilient device urges electronic register module 46 into its installed position in the manner described.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. An electronic register and meter frame for an electric meter comprising:
    an electronic register module;
    said meter frame including at least a face plate and a back plate;
    means for affixing said back plate spaced a predetermined distance from said face plate, thereby providing a predetermined space therebetween;
    said electronic register module including a skid plate affixed thereto;
    said skid plate including at least a first cantilevered spring finger thereon;
    a first button in said first cantilevered spring finger;
    said first button contacting and sliding upon said back plate during insertion and removal of said electronic register module, and said first cantilevered spring finger providing a first resilient force urging said electronic register module toward said face plate; and
    guidance means at a rear surface of said back plate for providing side-to-side guidance of said at least a first button during an intermediate stage of said insertion and removal.

2. An electronic register and meter frame according to claim 1 wherein:
    said at least a first cantilevered spring finger includes at least first and second cantilevered spring fingers;
    said second cantilevered spring finger includes a second button;
    said first button being disposed at a front end of said skid plate, and said first cantilevered spring finger providing said first resilient force urging a front end of said electronic register module toward said face plate; and
    said second button including means for sliding contact with a surface of said back plate, and said second cantilevered spring finger providing a second resilient force urging a rear end of said electronic register module toward said face plate, whereby said electronic register module is secured in said operational position.

3. An electronic register and meter frame according to claim 2 wherein said guidance means include a mousehole in said back plate, said second button is slideable into said mousehole at said intermediate stage, and edges of said mousehole being effective for providing said guidance.

4. An electronic register and meter frame according to claim 2 wherein said first and second buttons are frusto-conical buttons.

5. An electronic register and meter frame according to claim 4 wherein said back plate includes at least one depression disposed in a position which aligns with one of said first and second frusto-conical buttons when said electronic register module is in its operational position, a tip of said frusto-conical button being positioned to enter said depression and further being effective for retaining said electronic register module in said operational position.

6. An electronic register and meter frame according to claim 2 wherein said skid plate includes a first access slot for access to components behind said skid plate.

7. An electronic register and meter frame according to claim 2 wherein said face plate includes at least one slot and said electronic register module includes at least one locking ramp, said at least one locking ramp engaging said at least one slot when said electronic register module is in said operational position and being effective for resisting movement of said electronic register module from said predetermined space.

8. An electronic register module according to claim 7 wherein said face plate includes a portion at least in the vicinity of said at least one slot which is unsecured to said frame, said portion being deformable for permitting said at least one locking ramp to pass thereunder for removal and insertion of said electronic register module and said face plate having a resilience sufficient to urge said at least one slot into locking engagement with said at least one locking ramp.

9. An electronic register module and meter frame according to claim 1 wherein said electronic register module includes at least one guide boss thereon extending toward said face plate and said face plate includes at least one slot engageable with said at least one guide boss during insertion of said electronic register module into said meter frame.

* * * * *